United States Patent [19]

Ohsono et al.

[11] Patent Number: 6,060,782
[45] Date of Patent: May 9, 2000

[54] SEMICONDUCTOR DEVICE WITH IMPROVED MOUNTING ON TAPE-SHAPED INSULATING SUBSTRATE

[75] Inventors: Mitsuaki Ohsono, Sakurai; Kenji Toyosawa, Ikoma, both of Japan

[73] Assignee: Sharp Kabushiki Kaisha, Osaka, Japan

[21] Appl. No.: 09/205,182

[22] Filed: Dec. 4, 1998

[30] Foreign Application Priority Data

Jan. 26, 1998 [JP] Japan ................... 10-013052

[51] Int. Cl.⁷ .................................................. H01L 29/40
[52] U.S. Cl. .......................... 257/738; 257/746; 257/778
[58] Field of Search ................................... 257/738, 777, 257/778, 773, 746, 795

[56] References Cited

U.S. PATENT DOCUMENTS 4,811,081  3/1989  Lyden .................................. 257/746

FOREIGN PATENT DOCUMENTS 08088245A  4/1996  Japan .
08102474A  4/1996  Japan .
08148526A  6/1996  Japan .

*Primary Examiner*—David B. Hardy
*Attorney, Agent, or Firm*—Nixon & Vanderhye, PC

[57] ABSTRACT

In a substrate, a device hole is punched, and a metal wiring pattern is formed on the substrate. Then, an insulating film is formed from the side of the metal wiring pattern so as to cover at least the device hole. In this state, the insulating film is formed for fixing the inner leads of the metal wiring pattern, which are projected on the device hole. Then, the semiconductor chip is provided so as to face the device hole from the side of the substrate, and the electrode is connected to the inner leads via the ACF by thermocompression. The described arrangement is provided so as to realize an extremely narrow frame in a liquid crystal module. According to the described method, a quality TCP semiconductor device can be manufactured in a simple manner at high yield.

13 Claims, 12 Drawing Sheets

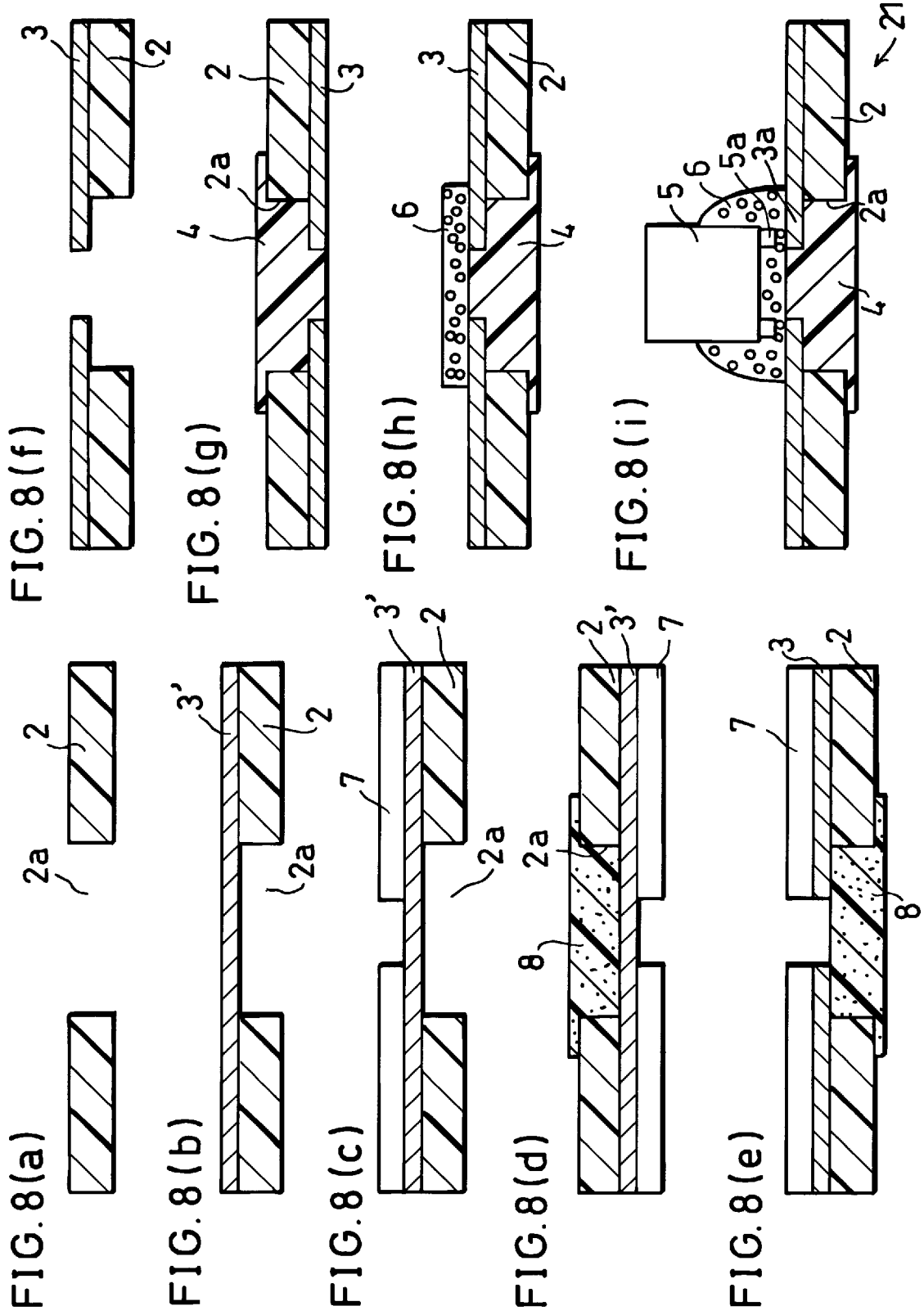

SEMICONDUCTOR DEVICE WITH IMPROVED MOUNTING ON TAPE-SHAPED INSULATING SUBSTRATE

FIELD OF THE INVENTION

The present invention relates to a TCP (Tape Carrier Package) device, a TBGA (Tape Ball Grid Array) semiconductor device, etc., which permits improved quality, reduction in size and cost, and a method of manufacturing the same.

BACKGROUND OF THE INVENTION

Conventionally, COT (Chip on Tape) semiconductor devices wherein semiconductor chips are offset to be mounted on flexible tapes that can be freely bent are known. FIG. 13 shows a structure of a TCP semiconductor device 51 as one example of the COT semiconductor devices. The TCP semiconductor device 51 is prepared such that a metal wiring pattern 53 is formed on a substrate 52, and to inner leads 53a of the metal wiring pattern 53 which are positioned in a vicinity of a center of the substrate 52, a semiconductor chip 54 is connected by an ILB (Inner Lead Bonding) process via an ACF (Anisotropic Conductive Film). The metal wiring pattern 53 is connected to an external circuit by means of outer leads 53b of the metal wiring pattern 53 formed in the end portions of the substrate 52 by the OLB (Outer Lead Bonding) process.

It may be also arranged such that device holes 52a are formed around a center of the substrate 52, and in this region, a semiconductor chip 54 is mounted to inner leads 53a of the metal wiring pattern 53 by the ILB like a TCP semiconductor device 61 shown in FIG. 14. In this structure, the semiconductor chip 54 and the inner leads 53a are sealed with resin 62 so as to protect them mechanically.

The described TCP semiconductor devices 51 and 61 are typically used for liquid crystal drivers. The structures wherein these liquid crystal drivers are mounted to liquid crystal modules are shown in FIG. 15 and FIG. 16 respectively.

The liquid crystal module can be roughly divided into two parts: a display section 71 for use in an image display area of a liquid crystal panel; and a frame section 72 for mounting therein a drive circuit for driving the liquid crystal section 71. The described TCP semiconductor devices 51 and 61 are provided in the frame section 72, and one of the outer leads 53b is connected to a glass panel wiring 73a formed on a glass panel 73, and the other outer lead 53b is connected to an input substrate wiring 74a formed on an input substrate 74. In the described liquid crystal module, the semiconductor chip 54 functions as a driver IC of the display section 71.

Next, the structure of a TBGA semiconductor device 81 as another example of the COT semiconductor devices is shown in FIG. 17. The TBGA semiconductor device 81 is arranged such that connecting paths for connecting metal wiring pattern 53 and the back surface side of the substrate 52 are formed by punching throughholes 52b in the substrate 52 having formed thereon the metal wiring pattern 53, and solder balls (or conductive projections) 83 which permit a connection with the external circuit are arranged in a form of grid at the leading end portions of the conductive paths 82. On the side of the metal wiring pattern 53 of the substrate 52, a semiconductor chip 54 is face-down connected to the metal wiring pattern 53 via an anisotropic conductive film 55.

An array of the solder balls 83 in a form of a grid is called a BGA (Ball Grid Array). The connection between the external circuit and the BGA is performed by controlling the surface extension or the viscosity characteristics of the solder by melting the solder balls 83 in a reflow furnace. This method was developed by IBM in the U.S.A. as a technique of soldering the semiconductor chip to a ceramic substrate at high density, and is known as the controlled collapse chip connection (C4 method).

The described tape ball grid array (TBGA) semiconductor device 81 is disclosed by Japanese Unexamined Patent Publication No. 102474/1996 (Tokukaihei 8-102474). Other known TBGA semiconductor devices TBGA includes semiconductor devices 91 and 101 wherein device holes 52a are formed in a vicinity of a center of the substrate 52, and the semiconductor chip 54 is connected to the metal wiring pattern 53 as disclosed in Japanese Unexamined Patent Publication No. 88245/1996 and Japanese Unexamined Patent Publication No. 148526/1996 (see FIG. 18 and FIG. 19). Here, the semiconductor chip 54 is connected to the inner leads 53a which are parts of the metal wiring patterns 53 and are projected on the device holes 52a. Then, solder balls 83 are formed at predetermined positions of the metal wiring pattern 53 outside the area on the device holes 52a. Although not shown, another arrangement is known wherein after a semiconductor chip is die-bonded to the substrate, the semiconductor chip and the metal wiring pattern are mounted by wire-bonding.

However, when mounting the TCP semiconductor chip 51 shown in FIG. 13 to a liquid crystal module, the structure of the semiconductor chip 54 shown in FIG. 15 which is projected from the substrate 52 to the metal wiring pattern 53 requires a space for storing therein the semiconductor chip 54 between the glass panel 73 and the input substrate 74. For the liquid crystal module, the smaller the width of the frame 72, the greater the area of the display section 71, and thus the quality of the product can be improved as it offers clearer images. On the other hand, it is not preferable to ensure the space for storing the semiconductor chip 54 as shown in FIG. 15 as a wider frame 72 is required.

In order to eliminate the described problem, another arrangement has been proposed wherein a longer substrate is adopted so as to bend the TCP semiconductor device such that the lengthwise direction of the glass panel and the lengthwise direction of the input substrate form a right angle. In this method, however, problems arise in that costs increase by adopting the longer substrate, and therefore the throughput in the manufacturing processes is lowered, thereby increasing manufacturing costs.

In the structure wherein a longer substrate cannot be adopted, it may be arranged so as to cut a part of the input substrate so as to allow the semiconductor chip to be stored therein. In this method, however, even if the width of the frame can be made narrower, preciseness is required to cut the part of the input substrate to be suited for the size of the semiconductor chip, which increases the manufacturing costs.

In the case of adopting the TCP semiconductor device 61 shown in FIG. 14, as the semiconductor chip 54 is mounted on the different side of the metal wiring pattern 53 with respect to the substrate 52, when mounting the TCP semiconductor device 61 to the liquid crystal module, the glass panel 73 and the input substrate 74 can be proximate to each other as shown in FIG. 16. However, when an attempt is made to reduce the width of the frame 72 in the described manner, as the semiconductor chip 54 is connected to the inner leads 53a by the thermocompression, it is likely that the inner leads 53a are deformed, which lowers a yield of the manufacturing process.

On the other hand, in the structure of the TBGA semiconductor device 81 shown in FIG. 17 given as another example of the COT semiconductor device, to conduct the semiconductor balls (or conductive projections) 83 and the metal wiring patterns 53, throughholes 52b are punched in the substrate 52 beforehand. In order to punch the throughholes 52b, high precision NC processing, laser processing, or punching with a mold is required. In the case of punching the throughholes 52b by the NC processing or the punching through the mold, a processing time is required in proportion to the number of the throughholes 52b, which results in an increase in the manufacturing costs. In the case of punching the throughholes 52b by the processes using a laser beam, expensive facilities are required.

The TBGA semiconductor device 91 shown in FIG. 18 and the TBGA semiconductor device 101 shown in FIG. 19 are arranged such that after connecting the inner leads 53a to the semiconductor chip 54, in order to mechanically protect the inner leads 53a and the surface of the semiconductor chip 54, these members are coated with resin. For this reasons, the metal wiring patterns 53 or the solder balls (or conductive projections) 83 which are required for the mounting of the substrate 82 cannot be formed in the area of the device holes 52a. As a result, a layout of the pattern on the package of the TBGA semiconductor devices 91 and 101 is restricted which lowers a degree of freedom, thereby presenting the problem that semiconductor balls (or conductive projections) 83 cannot be arranged in a full matrix.

Furthermore, in the case of adopting the TBGA semiconductor devices 81, 91 and 101, as it is likely that the package warps, a self-alignment is difficult to be achieved when connecting the BGA to the external circuit substrate. Namely, the warpage of the package causes the problem that the external circuit substrate and the package cannot be bonded uniformly within the connection surface, and there may exist an unconnected part between the solder paste applied to the external substrate and the solder balls (conductive projections) 83 of the package. As described, a non-uniform package causes a problem of inferior connection between the solder balls and the external circuit substrate.

SUMMARY OF THE INVENTION

It is an object of the present invention to provide a semiconductor device suited for quality TCP semiconductor devices which can realize very narrow frames in liquid crystal modules and quality TBGA semiconductor devices which offer high productivity and a method of manufacturing the same.

In order to achieve the above object, a semiconductor device of the present invention is characterized by including:
a semiconductor chip;
a tape-shaped insulating substrate with a device hole formed at position confronting the semiconductor chip;
a metal wiring pattern formed on the substrate, the metal wiring pattern being connected to the semiconductor chip; and
an insulating film formed so as to cover the device hole at least from a side of the substrate opposite to a side where the semiconductor chip is mounted.

According to the described arrangement, since the insulating film is formed so as to cover at least the device hole, the metal wiring pattern can be drawn also in the region on the device hole. Then, since the insulating film is formed on the opposite side of the semiconductor chip with respect to the substrate, irrespectively of on which side of the substrate the metal wiring pattern is formed, the semiconductor chip can be connected to the metal wiring pattern in the region of the device hole by the flip-chip method.

Therefore, in the case of mounting the liquid crystal module as the TCP semiconductor device, by forming the metal wiring pattern and the semiconductor chip on the opposite sides of the substrate, the metal wiring pattern can be connected both to the glass panel and the input substrate, and the semiconductor chip is provided on the opposite side. This eliminates a need of ensuring a space for storing the semiconductor chip between the glass panel and the input substrate, and the glass panel and the input substrate can be adjacently placed, thereby realizing a frame of a narrower width.

Furthermore, since the inner leads projected in the region on the device hole of the metal wiring pattern are fixed by the insulating film, it is not likely that the inner leads are deformed by the ILB (Inner Lead Bonding) process. In the meantime, by connecting the semiconductor chip to the metal wiring pattern using the ACF (Anisotropic Conductive Film) by the flip-chip method, an ILB process can be performed at significantly lower temperature than the conventional connecting method wherein bumps made of gold tin eutectic or gold-gold are subjected to thermocompression using a tool heated to high temperature. For this beneficial feature that the semiconductor chip can be connected to the metal wiring pattern at lower temperature, a damage on the electrodes of the semiconductor chip in the ILB process can be reduced, thereby obtaining a quality TCP semiconductor device. Furthermore, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the inner leads of the metal wiring pattern projected to the device hole are fixed by the insulating film, when connecting the semiconductor chip by the flip-chip method, it is not necessary to seal with resin for mechanically protecting the semiconductor chip and the inner leads. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement, within the region on the device hole, a semiconductor device package can be reduced in size. As a result, the liquid crystal module to which the semiconductor chip is mounted as a TCP semiconductor device can be reduced in size, and the throughput in the manufacturing process can be improved for this size reduction.

As a result, a semiconductor device is applicable to a quality TCP semiconductor device which realizes a very narrow frame in the liquid crystal module and to a quality TBGA semiconductor device which can be produced at high yield.

The described semiconductor device of the present invention may be arranged such that the metal wiring pattern is formed on the insulating film, or the metal wiring pattern is buried in the insulating film.

According to the described arrangement, since the metal wiring pattern is formed on the insulating film or buried in the insulating film, an area to which the metal wiring pattern is drawn can be increased for the area on the device hole.

The semiconductor device of the present invention may be arranged such that the metal wiring pattern is formed so as to cover the device hole of the insulating film.

According to this arrangement, by storing a part of the metal wiring pattern, which is provided outside of the device hole in the conventional arrangement, within the region on the device hole, a semiconductor package can be reduced in size. As a result, a module such as a liquid crystal module to which the semiconductor device is mounted can be reduced in size, and the throughput in the manufacturing process can be improved for this size reduction.

The semiconductor device of the present invention may be arranged so as to include conductive terminals for conducting the metal wiring pattern formed so as to cover the device hole of the insulating film to an external circuit.

The conductive terminals are formed on the opposite side of the semiconductor chip with respect to the substrate. Therefore, in the conventional semiconductor device in which the device hole is not formed, to conduct the metal wiring pattern formed on the side of the semiconductor chip to the external circuit, it is required to form the conductive terminals by punching the throughhole in the substrate. However, according to the present invention, the metal wiring pattern formed on the opposite side of the semiconductor chip with respect to the substrate can be connected to the semiconductor chip within the device hole, and the conductive terminals can be directly formed in the metal wiring pattern. As a result, the process of punching the throughhole in the substrate can be omitted, thereby manufacturing the TBGA semiconductor device at low cost and high throughput.

Additionally, the device hole is covered with the insulating film, and the inner leads in the metal wiring pattern formed in this region are fixed by the insulating film. Therefore, the sealing with resin for mechanically protecting the semiconductor chip and the inner leads is not required, and the conductive terminals can be formed in this region. As a result, the conductive terminals such as semiconductor balls can be arranged in the full matrix on the metal wiring pattern, and the layout pattern is less restricted.

Each of the described arrangements of the semiconductor device of the present invention may be arranged such that the metal wiring pattern and the semiconductor chip are formed on the same side of the substrate.

The semiconductor device of the described structure may have an inverse bond structure wherein the metal wiring pattern and the semiconductor chip are formed on the same side of the substrate. In this semiconductor device of the inverse bond structure, since the inner leads projected in the region on the device hole of the metal wiring pattern are fixed by the insulating film, it is not likely that the inner leads are deformed in the ILB process. Similarly, by adopting the flip-chip method, the ILB process can be carried out at significantly lower temperature than the case of adopting the conventional method of thermocompressing the bumps. Therefore, in the ILB process, a damage on the electrode by the semiconductor chip can be reduced, and a quality semiconductor device can be obtained.

Furthermore, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the inner leads of the metal wiring pattern projected to the device hole are fixed by the insulating film, when connecting the semiconductor chip by the flip-chip method, it is not necessary to seal with resin for mechanically protecting the semiconductor chip and the inner leads. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement, within the region on the device hole, a semiconductor device package can be reduced in size. As a result, the liquid crystal module to which the semiconductor chip is mounted as a TCP semiconductor device can be reduced in size, and the throughput in the manufacturing process can be improved for this size reduction.

Each of the described semiconductor device of the present invention may be arranged such that the metal wiring pattern and the semiconductor chip are formed on opposite sides of the substrate.

In the described arrangement, the semiconductor device has a normal bond structure wherein the metal wiring pattern and the semiconductor chip are formed on opposite sides of the substrate. When mounting the semiconductor device of the normal bond structure to the liquid crystal module as a TCP semiconductor device, the metal wiring pattern can be connected both to the glass panel and the input substrate, and the semiconductor chip is provided on the opposite side. This eliminates a need of ensuring a space for storing the semiconductor chip between the glass panel and the input substrate, and the glass panel and the input substrate can be adjacently placed, thereby realizing a narrower frame.

Furthermore, since the inner leads projected in the region on the device hole of the metal wiring pattern are fixed by the insulating film, it is not likely that the inner leads are deformed by the ILB process. In the meantime, by adopting the flip chip method, an ILB process can be performed at significantly lower temperature than the conventional connecting method wherein bumps are subjected to thermocompression. For this beneficial feature that the semiconductor chip can be connected to the metal wiring pattern at low temperature, a damage on the electrodes by the semiconductor chip in the ILB process can be reduced, thereby obtaining a quality TCP semiconductor device.

Furthermore, by arranging such that the insulating film has substantially the same coefficient of linear thermal expansion as the substrate, the warpage of the package of the semiconductor device can be suppressed. As a result, an improved yield of the manufacturing process when reflow mounting can be achieved. Furthermore, since the metal wiring pattern (inner leads) projected to the device hole is fixed by the insulating film, when connecting the semiconductor chip by the flip-chip method, it is not necessary to seal with resin for mechanically protecting the semiconductor chip and the inner leads. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement, within the region on the device hole, a semiconductor device package can be reduced in size. As a result, the liquid crystal module to which the semiconductor chip is mounted as a TCP semiconductor device can be reduced in size, and the throughput in the manufacturing process can be improved for this size reduction.

As described, in order to achieve the above object, the method of manufacturing the semiconductor device of the present invention may be arranged so as to include the steps of:

punching a device hole in a tape-shaped insulating substrate at position where a semiconductor chip is to be mounted so as to confront the device hole;

forming a metal wiring pattern on the substrate having formed therein the device hole so as to be projected at least on the substrate;

forming an insulating film on the device hole so as to cover the device hole at least from the side of the substrate, the insulating film being formed so as to fix the metal wiring pattern projected on the device hole; and forming the semiconductor chip on a side of the substrate opposite to a side where the insulating film is formed to be connected to the metal wiring pattern.

The semiconductor device prepared by the described method has an inverse bond structure wherein the metal wiring pattern and the semiconductor chip are formed on the same side of the substrate. In this semiconductor device of the inverse bond structure, since the inner leads projected in the region on the device hole of the metal wiring pattern are fixed by the insulating film, it is not likely that the inner leads are deformed in the ILB process. Similarly, by adopting the flip-chip method, the ILB process can be carried out at significantly lower temperature than the case of adopting the conventional method of thermocompressing the bumps. Therefore, in the ILB process, a damage on the electrodes by the semiconductor chip can be reduced, and a quality semiconductor device can be obtained.

Furthermore, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the metal wiring pattern projected to the device hole (inner leads) is fixed by the insulating film, when connecting the semiconductor chip by the flip-chip method, it is not necessary to seal with resin for mechanically protecting the semiconductor chip and the inner leads. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement, within the region on the device hole, a semiconductor device package can be reduced in size. As a result, the liquid crystal module to which the semiconductor chip is mounted as a TCP semiconductor device can be reduced in size, and the throughput in the manufacturing process can be improved for this size reduction.

In order to achieve the above object, the method of manufacturing a semiconductor device in accordance with the present invention may be arranged so as to include the steps of:

punching a device hole in a tape-shaped insulating substrate at position where a semiconductor chip is to be mounted so as to confront the device hole;

forming a metal wiring pattern on the substrate having formed therein the device hole so as to be projected at least on the substrate;

forming an insulating film on the device hole so as to cover the device hole at least from the side of the metal wiring pattern, the insulating film being formed so as to fix the metal wiring pattern projected on the device hole; and forming the semiconductor chip on a side of the substrate opposite to a side where the insulating film is formed to be connected to the metal wiring pattern.

The semiconductor device prepared in the described processes has a normal bond structure wherein the metal wiring pattern and the semiconductor chip are formed on opposite sides of the substrate. When mounting the semiconductor device of the normal bond structure to the liquid crystal module as a TCP semiconductor device, the metal wiring pattern can be connected both to the glass panel and the input substrate, and the semiconductor chip is provided on the opposite side. This eliminates a need of ensuring a space for storing the semiconductor chip between the glass panel and the input substrate, and the glass panel and the input substrate can be adjacently placed, thereby realizing a narrower frame.

Furthermore, since the inner leads projected in the region on the device hole of the metal wiring pattern are fixed by the insulating film, it is not likely that the inner leads are deformed by the ILB process. In the meantime, by adopting the flip-chip method, an ILB process can be performed at significantly lower temperature than the conventional connecting method wherein bumps are subjected to thermocompression. As a result, a damage on the electrodes by the semiconductor chip in the ILB process can be reduced, thereby obtaining a quality semiconductor device.

Additionally, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the metal wiring pattern (inner leads) projected to the device hole is fixed by the insulating film, when connecting the semiconductor chip by the flip-chip method, it is not necessary to seal with resin for mechanically protecting the semiconductor chip and the inner leads. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement, within the region on the device hole, a semiconductor device package can be reduced in size. As a result, a liquid crystal module to which the semiconductor chip as a TCP semiconductor device is mounted can be reduced in size, and the throughput in the manufacturing process can be improved for this size reduction.

For a fuller understanding of the nature and advantages of the invention, reference should be made to the ensuing detailed description taken in conjunction with the accompanying drawings.

BRIEF DESCRIPTION OF THE DRAWINGS

FIG. 8(a) through FIG. 8(i) are explanatory views showing processes of manufacturing the semiconductor device of FIG. 6;

DESCRIPTION OF THE EMBODIMENTS

First Embodiment

The following descriptions will explain a semiconductor device and a method of manufacturing the semiconductor device in accordance with one embodiment of the present invention in reference to FIG. 1 through FIG. 5.

Figure 1:
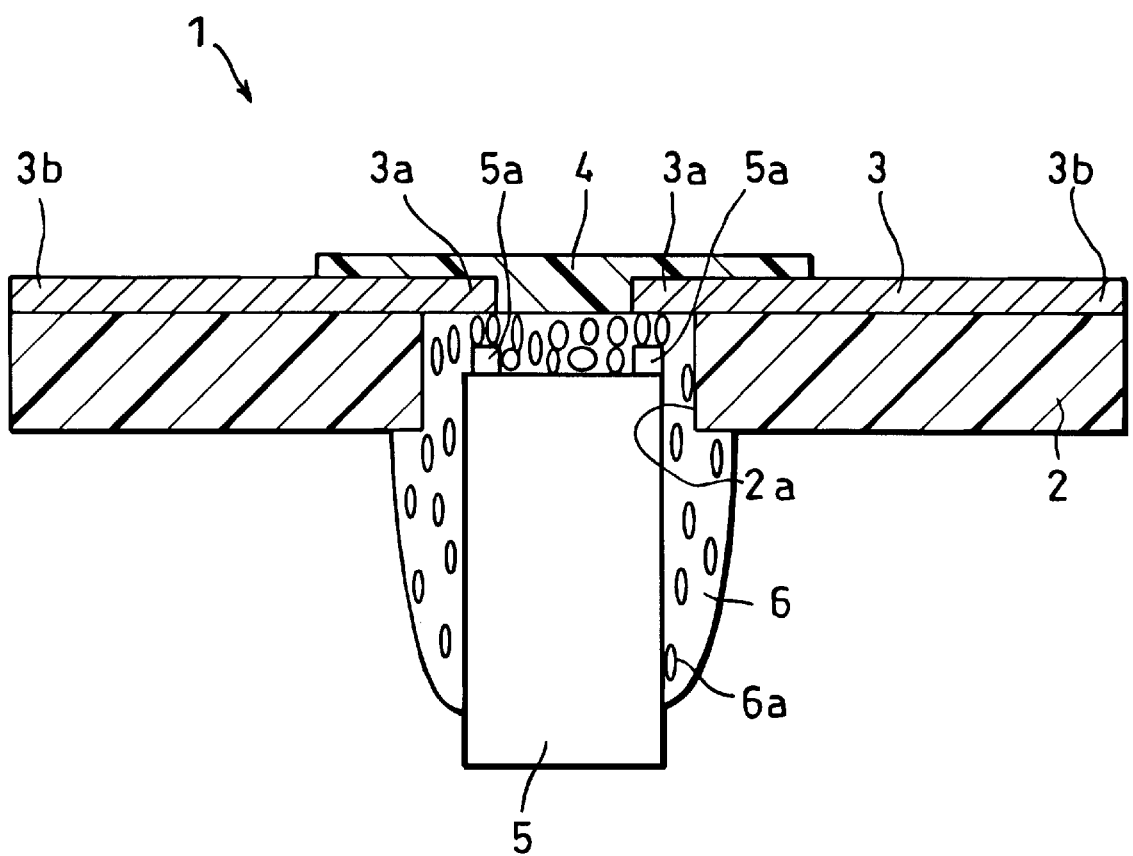
FIG. 1 is a cross-sectional view showing the structure of the semiconductor device in accordance with the first embodiment of the present invention.

In the present embodiment, a TCP semiconductor device 1 shown in FIG. 1 is adopted. The TCP semiconductor device 1 includes a substrate 2, a metal wiring pattern 3, an insulating film 4, a semiconductor chip 5, and an ACF (Anisotropic Conductive Film) 6. The TCP semiconductor device 1 has a normal bond structure wherein the semiconductor chip 5 and the metal wiring pattern 3 are formed on opposite sides of the substrate 2. The structure of the TCP semiconductor device 1 is characterized in that the inner leads 3a projected to the device holes 2a punched in the substrate 2 are connected to the substrate 2 by the insulating film 4 formed from the side of the metal wiring pattern 3.

The substrate 2 is a carrier in a form of a tape made of an insulating and flexible material such as polyimide, etc. At around the central portion confronting the semiconductor chip to be described later, device holes 2a are formed by punching with a mold. The metal wiring pattern 3 is provided for electrically connecting the semiconductor chip 5 with the external circuit. The metal wiring pattern 3 is formed from a copper foil or metal foil into a predetermined pattern by a photo-lithography process, etc. The projected portion in the area on the device holes 2a is called inner leads 3a to be connected to the electrodes 5a of the semiconductor chip 5. The portion formed on the periphery of the substrate 2 is called outer leads 3b, and is connected to the glass panel wiring in the liquid crystal module and the external circuit such as the input substrate wiring, etc.

The insulating film 4 is made of a solder resist of a small thermal shrinkage. Suited materials for the insulating film 4 include polyimides which are used in the substrate 2, and other that, UV (ultraviolet ray) setting, urethane, silicone or epoxy solder resists may be adopted. Further, a material of a coefficient of linear expansion close to that of the substrate 2 is selected so that the warpage of the package of the TCP semiconductor device 1 is not more than a predetermined size, for example, not more than 100 μm when forming the insulating film 4. In order to reduce the warpage, a filling agent made of an elastic member, etc., may be mixed with the solder resist for releasing the stress. The insulating film 4 is formed so as to cover at least the device holes 2a from the side of the metal wiring pattern 3 with respect to the substrate 2. The insulating film 4 thus manufactured has a function of fixing the inner leads 3a projected in the area of the device hole 2a. Therefore, the metal wiring pattern 3 may be drawn in the area on the device hole 2a.

The semiconductor chip 5 functions as a driver IC of the liquid crystal panel in the liquid crystal module. To one end face, electrodes 5a are formed so as to electrically connect the inner leads 3a in the device holes 2a. In the connecting process, an ACF 6 is laminated so as to cover the device holes 2a, and the semiconductor chip 5 is bonded thereto by the thermocompression. Since a plurality of conductive particles 6a exist within the ACF 6, these conductive particles 6a interposed between the electrodes 5a and the inner leads 3a permit the conductive state between them.

Figure 2:
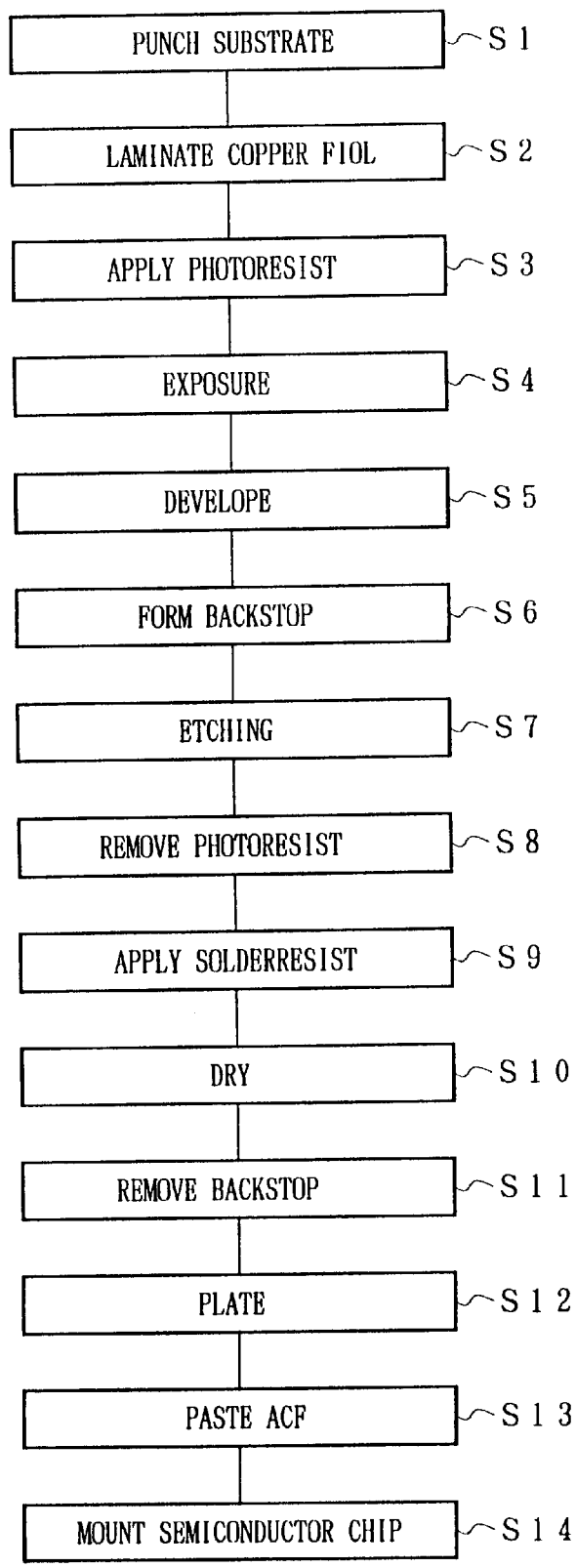
FIG. 2 is a flowchart explaining a method of manufacturing the semiconductor device shown in FIG. 1.
Figure 3:
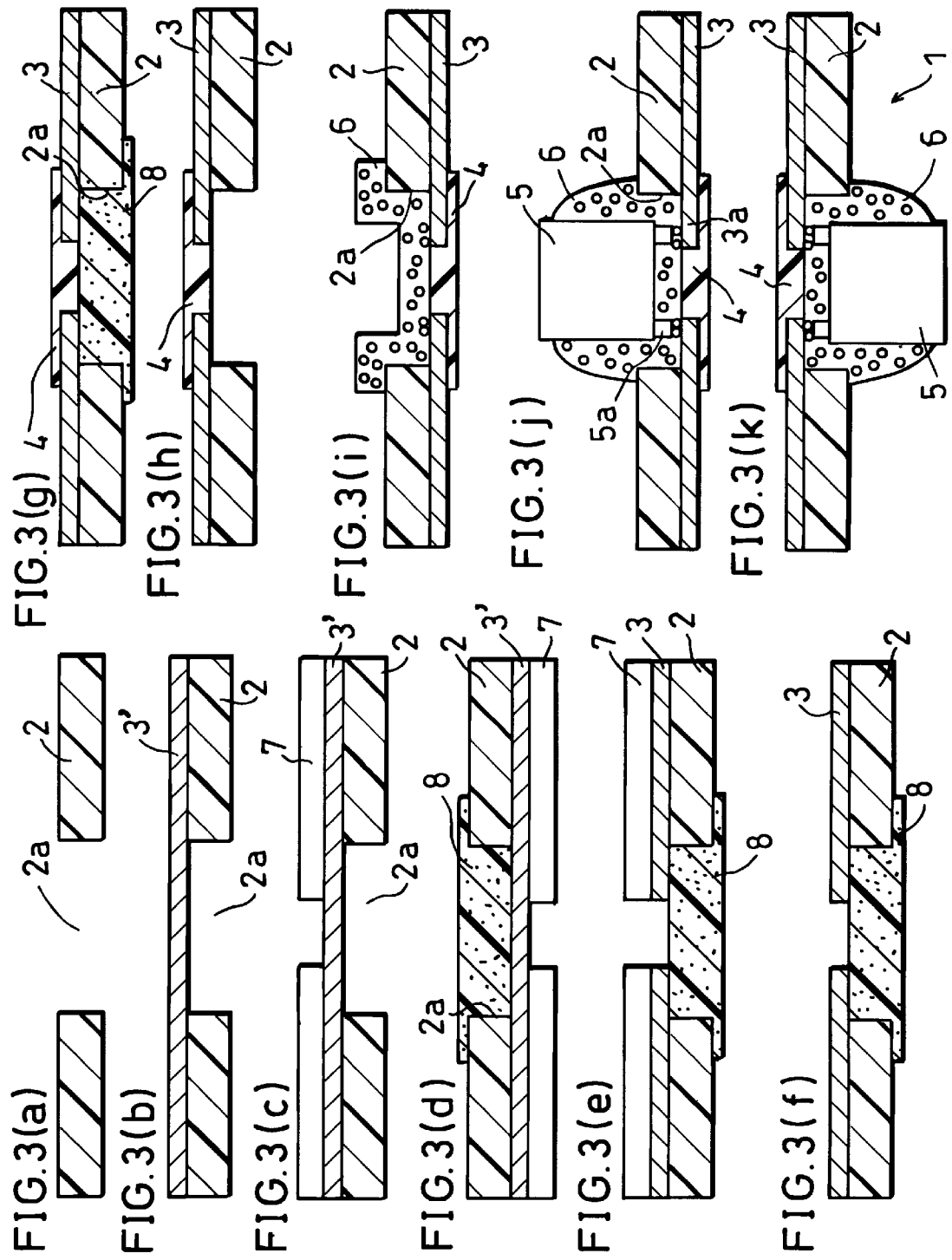
FIG. 3(a) through FIG. 3(k) are explanatory views showing the processes of manufacturing the semiconductor device shown in FIG. 1.

Next, the method of manufacturing the TCP semiconductor device 1 having the described structure will be explained in reference to FIG. 2 and FIG. 3.

In Step 1, the substrate 2 is punched with the mold to form device hole 2a (see FIG. 3(a)). In Step 2, on the substrate 2 in which the device hole 2a is formed, a copper foil 3' is laminated (see FIG. 3(b)). Next, the photoresist 7 is applied onto the copper foil 3' by the spin coat method in Step 3. In Step 4, through a photomask on which a predetermined pattern is formed for forming the metal (copper) wiring pattern 3, a photoresist 7 is exposed with a UV light using a stepper or an aligner. Thereafter, in Step S5, the photoresist 7 which has been exposed is developed with a developing solution to form the photoresist 7 in the same pattern as the metal wiring pattern 3 (Step S3 through S5, see FIG. 3(c)).

In Step 6, when forming the copper foil 3' into a predetermined pattern, a backstop 8 (see FIG. 3(d)) made of resin, etc., is formed for preventing the copper foil 3' from being etched from the side of the device holes 2a. The backstop 8 is formed from the side of the substrate 2 so as to cover the device holes 2a by screen-printing liquid resin, etc. In Step 7, using an etching solution, the copper foil 3' is etched using the photoresist 7 as an etching mask to form the metal wiring pattern 3 (see FIG. 3(e)). Upon completing the etching, the photoresist 7 is separated using an organic solvent or dry etching in Step 8 (see FIG. 3(f)).

In Step 9, by screen-printing the substrate 2 from the side of the metal wiring pattern 3, the solder resist is formed as the insulating film 4 so as to cover at least the device hole 2a. In Step 10, the solder resist thus applied is dried (Steps 9 and 10 are shown in FIG. 3(g)). In the case of applying the solder resist so as to cover also the outer leads 3b of the metal wiring pattern 3, to ensure the connecting parts with the external circuit, the solder resist in the predetermined portion of the outer leads 3b is left open by the photo-lithography process.

After the insulating film 4 has been formed, the backstop 8 is separated using a separating agent in Step 11, and the insulating film 4 is plated on the metal wiring pattern 3 in Step 12 (see FIG. 3(h)).

The metal is formed thin on the metal wiring pattern 3 and is not specifically shown in the figure. For the plating material, metal materials of desirable soldering properties such as tin, solder, gold, silver, palladium or nickel, etc., may be adopted. Next, in Step 13, the ACF 6 is pasted or potted (see FIG. 3(i)) so as to cover the device hole 2a from the substrate 2, and the semiconductor chip 5 is mounted such that the electrodes 5a confront the inner leads 3a in Step 14, and the semiconductor chip 5 is mounted within the device holes 2a by the thermocompression by the flip-chip method (see FIG. 3(j)), thereby completing the TCP semiconductor chip 1 (see FIG. 3 (k)). The described manufacturing method is advantageous in that a conventional manufacturing device can be used, and there is no need to install a new device.

As described, in the TCP semiconductor device 1 in accordance with the present embodiment, as the inner leads 3a are fixed by the insulating film 4, it is not likely that the inner leads 3a are deformed in the ILB process. Additionally, when mounting the semiconductor chip 5, a connection by the flip-chip method using the ACF 6 can be performed. Therefore, compared with the case of adopting the conventional method wherein bumps 5b made of gold tin eutectic or gold-gold are subject to thermocompression with respect to inner leads each of which being supported by one side on the device hole using a tool heated to high temperature, the semiconductor chip 5 can be connected at significantly lower temperature. Therefore, the damage on the electrodes 5a of the semiconductor device 5 by the heat generated in the ILB process can be suppressed, thereby improving quality of the TCP semiconductor device 1.

Additionally, as the insulating film 4 is formed on the TCP semiconductor device 1 so as to suppress the tilt, the manufacturing yield in the reflow mounting process can be improved. According to the structure wherein the inner leads 3a projected to the area on the device holes 2a are fixed by the insulating film 4, in the case of connecting the semiconductor chip 5 by the flip-chip method, sealing with resin for mechanically protecting the semiconductor chip 5 and the inner leads 3a is not required. According to the described method, the TCP semiconductor device 1 can be manufactured at low cost in a simple manner.

Furthermore, since the metal wiring pattern 3 can be drawn in the area on the device hole 2a, by arranging such that the part of the metal wiring pattern, which is provided outside of the area of the device hole in the conventional arrangement, within the region on the device hole 2a, the package of the TCP semiconductor device 1 can be reduced in size. Therefore, the liquid crystal module to which the described TCP semiconductor device 1 is mounted can be reduced in size, and an improved throughput can be achieved in the manufacturing process for this size reduction of the liquid crystal module.

Figure 4:
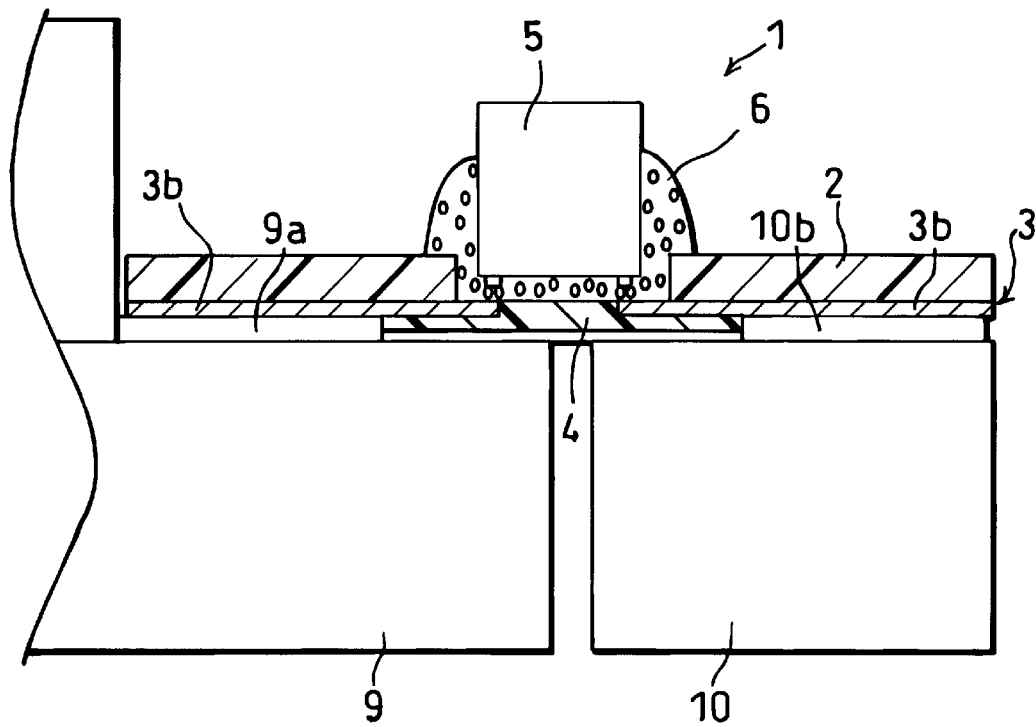
FIG. 4 is an explanatory view of the semiconductor device of FIG. 1 mounted to the liquid crystal module.

An example structure wherein the TCP semiconductor device 1 thus manufactured on the liquid crystal module is shown in FIG. 4. In FIG. 4, the outer leads 3b of the TCP semiconductor device 1 are connected to a glass panel wiring 9a on the glass panel 9, and the other outer leads 3b are connected to the input substrate wiring lob on the input substrate 10. The TCP semiconductor device 1 is arranged such that the semiconductor chip 5 is formed on the opposite side of the metal wiring pattern 3 with respect to the substrate 2. Therefore, it is not required to ensure the space for storing the semiconductor chip 5 between the glass panel 9 and the input substrate 10, and the glass panel 9 and the input substrate 10 can be adjacently formed. As a result, the frame of the liquid module can be made narrower.

Figure 5:
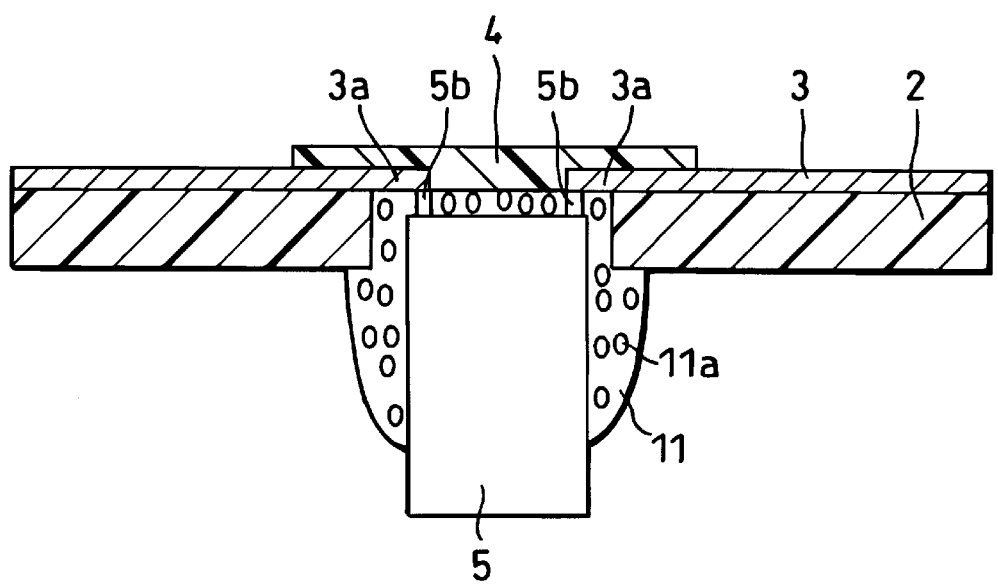
FIG. 5 is a cross-sectional view showing a structure of another semiconductor device in accordance with the first embodiment of the present invention.

In the present embodiment, the connection between the semiconductor chip 5 and the inner leads 3a is performed by the thermocompression of the ACF 6. As shown in FIG. 5, it may be also arranged such that bumps 5b made of gold tin eutectic or gold-gold are formed on the semiconductor chip 5, and the resulting bumps 5b are bonded to the inner leads 3b by the thermocompression. In this case, the semiconductor chips 5 and the inner leads 3a are sealed with the resin 11 in which the filling agent 11a is placed for releasing the stress.

As described, the semiconductor device of the present invention is arranged so as to include: a semiconductor chip; a tape-shaped insulating substrate with a hole formed at position confronting the semiconductor chip; a metal wiring pattern formed on the substrate, the metal wiring pattern being connected to the semiconductor chip; and an insulating film formed so as to cover the device hole at least from a side of the substrate opposite to a side where the semiconductor chip is mounted.

In the above arrangement, it is preferable that the metal wiring pattern be formed on the insulating film. The metal wiring pattern may be formed so as to cover the device hole on the insulating film.

The metal wiring pattern and the semiconductor chip may be formed on opposite sides of the substrate.

In the described arrangement, it is preferable that inner leads formed so as to be projected to an area on the device hole be fixed by the insulating film. It is also preferable that the insulating film have substantially a same coefficient of linear expansion as that of the substrate. The insulating film is made of, for example, a solder resist. It may be arranged such that the semiconductor chip and the metal wiring pattern are connected by an anisotropic conductive film.

The described semiconductor device of the present invention may be formed by the method which includes the steps of:

punching a device hole in a tape-shaped insulating substrate at position where a semiconductor chip is to be mounted so as to confront the device hole;

forming a metal wiring pattern on the substrate having formed therein the device hole so as to be projected at least on the substrate;

forming an insulating film on the device hole so as to cover the device hole at least from the side of the metal wiring pattern, the insulating film being formed so as to fix the metal wiring pattern projected on the device hole; and forming the semiconductor chip on a side of the substrate opposite to a side where the insulating film is formed to be connected to the metal wiring pattern.

Second Embodiment

The following descriptions will explain a semiconductor device and a method of manufacturing the same in accordance with another embodiment of the present invention in reference to FIG. 6 through FIG. 9. For conveniences in explanations, members having the same function as the first embodiment will be designated by the same reference numerals, and thus the descriptions thereof shall be omitted here.

Figure 6:
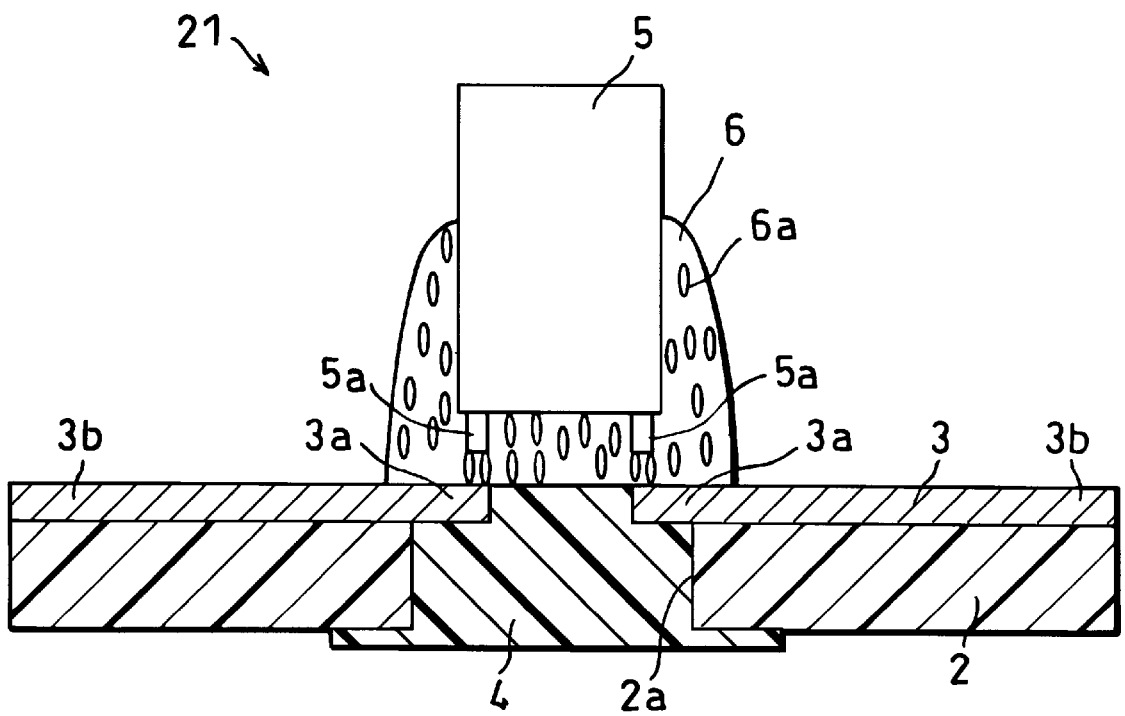
FIG. 6 is a cross-sectional view showing a structure of a semiconductor device in accordance with the second embodiment of the present invention.

In the present embodiment, a TCP semiconductor device 21 shown in FIG. 6 is adopted. The TCP semiconductor device 21 includes a substrate 2, a metal wiring pattern 3, an insulating film 4, a semiconductor chip 5, and an ACF 6. The TCP semiconductor device 21 has a reverse bond structure wherein the semiconductor chip 5 and the metal wiring pattern 3 are formed on the same side of the substrate 2. The structure of the TCP semiconductor device 1 is characterized in that the inner leads 3a projected to the device holes 2a punched in the substrate 2 are fixed to the substrate 2 by the insulating film 4 formed on the opposite side of the metal wiring pattern 3 with respect to the substrate 2. Other than the above, the TCP semiconductor device 21 of the present embodiment has the same structure as the semiconductor device 1 adopted in the first embodiment, and thus the explanations thereof shall be omitted here.

Figure 7:
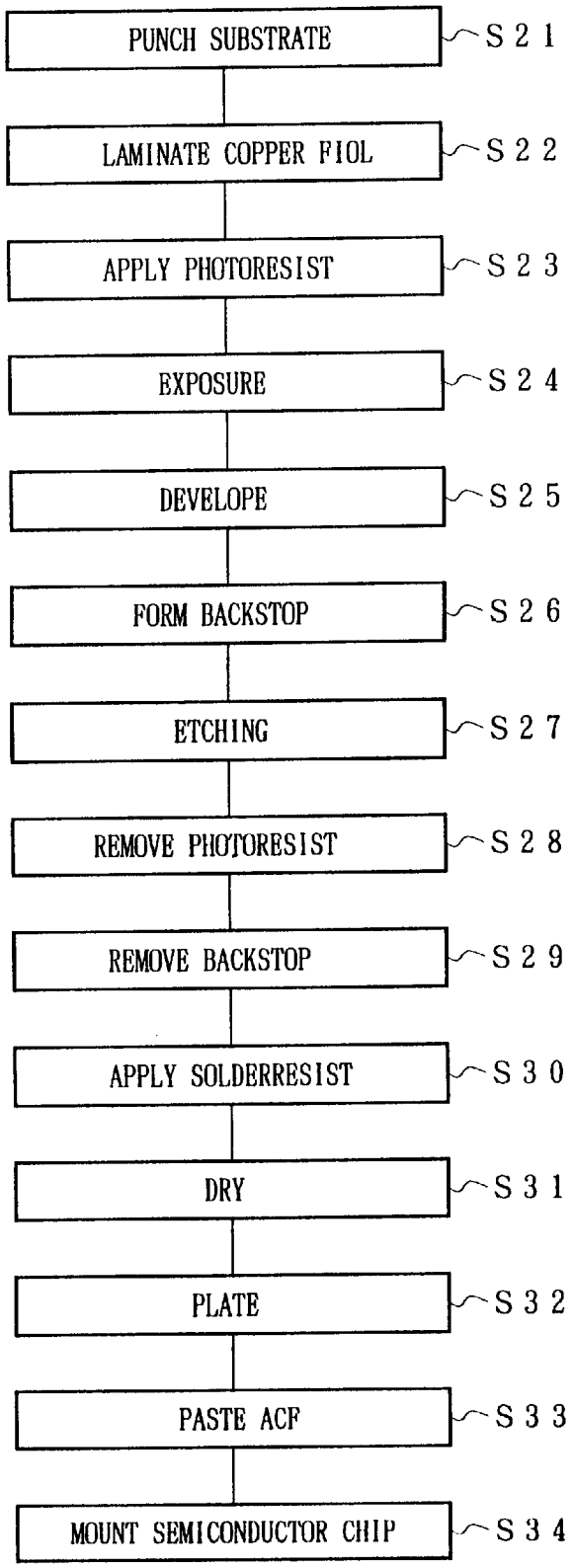
FIG. 7 is a flowchart explaining a manufacturing process of the semiconductor device of FIG. 6.

Next, the method of manufacturing the TCP semiconductor device 21 having the described structure will be explained in reference to FIG. 7 and FIG. 8.

In the Step 21, the substrate 2 is punched with the mold to form device holes 2a (see FIG. 8(a)). In Step 22, on the substrate 2 in which the device holes 2a are formed, a copper foil 3' is laminated (see FIG. 8(b)). Next, the photoresist 7 is applied onto the copper foil 3' by the spin coat method in Step 23. In step 24, through a photomask on which a predetermined pattern is formed for forming metal (copper) wiring pattern 3, the photoresist 7 is exposed with a UW light using a stepper or an aligner. Thereafter, in Step 25, the photoresist 7 which has been exposed is developed with a developing solution to form the photoresist 7 in the same pattern as the metal wiring pattern 3 (Steps 23 through 25 in FIG. 8(c)).

In Step 26, when forming the copper foil 3' into a predetermined pattern, a backstop 8 (see FIG. 8(d)) made of resin, etc., is formed for preventing the copper foil 3' from being etched from the side of the device holes 2a. The backstop 8 is formed from the side of the substrate 2 so as to cover the device holes 2a by screen-printing liquid resins, etc.

In Step 27, using an etching solution, the copper foil 31 is etched using the photoresist 7 as an etching mask to form the metal wiring pattern 3 (see FIG. 8(e)). Upon completing the etching, the photoresist 7 is separated using an organic solvent or dry etching in Step 28, and the backstop 8 is separated using a separating agent in Step 29 (Steps 28 and 29 in FIG. 8(f)).

In Step 30, by screen-printing the substrate 2 from the side of the substrate 2 opposite to the side where the metal wiring pattern 3 is formed, the solder resist is applied as the insulating film 4 so as to cover at least the device holes 2a. In Step 31, the solder resist thus applied is dried, and the metal wiring pattern 3 is plated in Step S32 (Steps 30 through 32 are shown in FIG. 8(g)). In the case of applying the solder resist in Step 31, the metal wiring pattern 3 is plated in Step 32 (Steps 30 through 32 are shown in FIG. 8(g)). As the plate is formed thin on the metal wiring pattern 3, it is not specifically shown in the figure. For the plating material, metal materials of desirable soldering properties such as tin, solder, gold, silver, palladium or nickel, etc., may be adopted.

Next, in Step 33, the ACF 6 is pasted or potted (see FIG. 8(h)) so as to cover the device holes 2a from the substrate 2, and the semiconductor chip 5 is mounted such that the electrodes 5a face the inner leads 3a in S34, and the semiconductor chip 5 is mounted within the device holes 2a by the thermocompression by the flip-chip method, thereby preparing the TCP semiconductor device 21 (see FIG. 8(i)). The described manufacturing method is advantageous in that a conventional manufacturing device can be used, and there is no need to install a new device.

Figure 14:
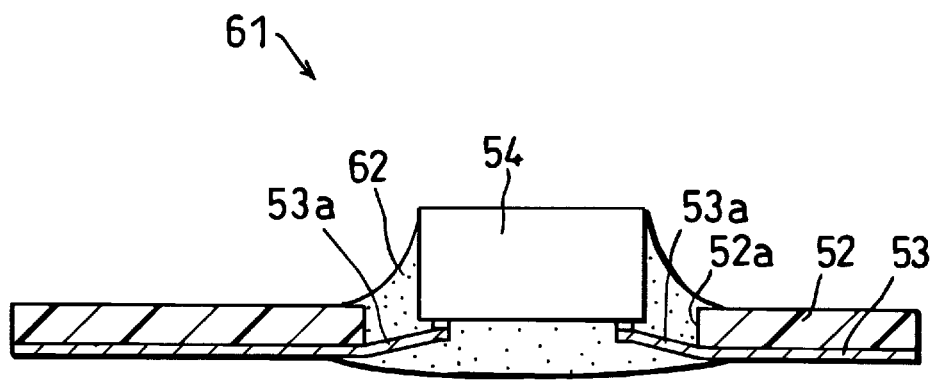
FIG. 14 is a cross-sectional view showing the structure of the semiconductor device in accordance with the second conventional semiconductor device.
Figure 15:
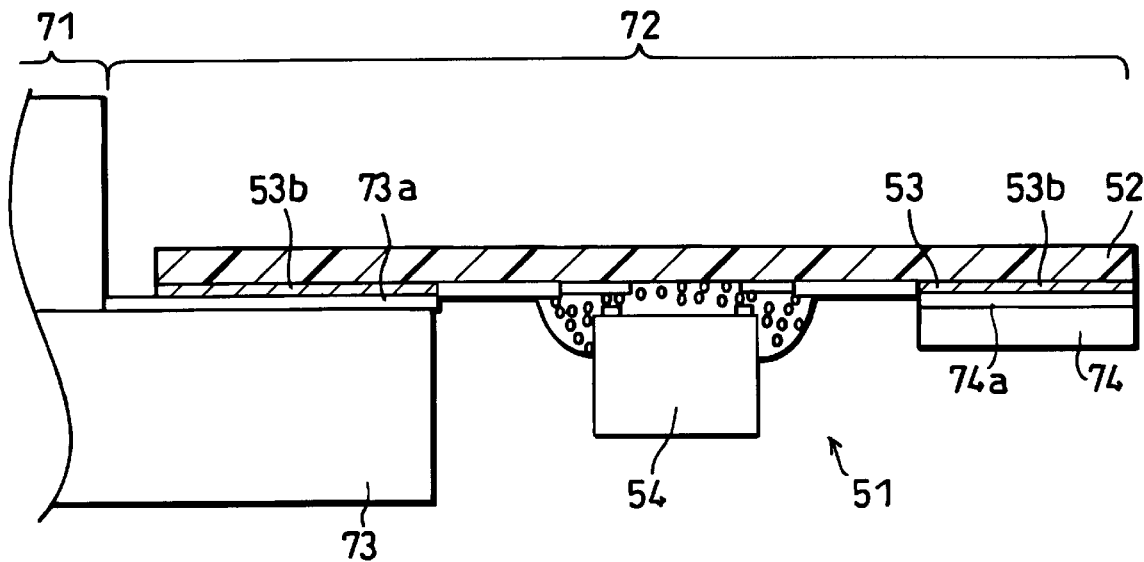
FIG. 15 is an explanatory view in which the semiconductor device shown in FIG. 13 is mounted to the liquid crystal module.
Figure 16:
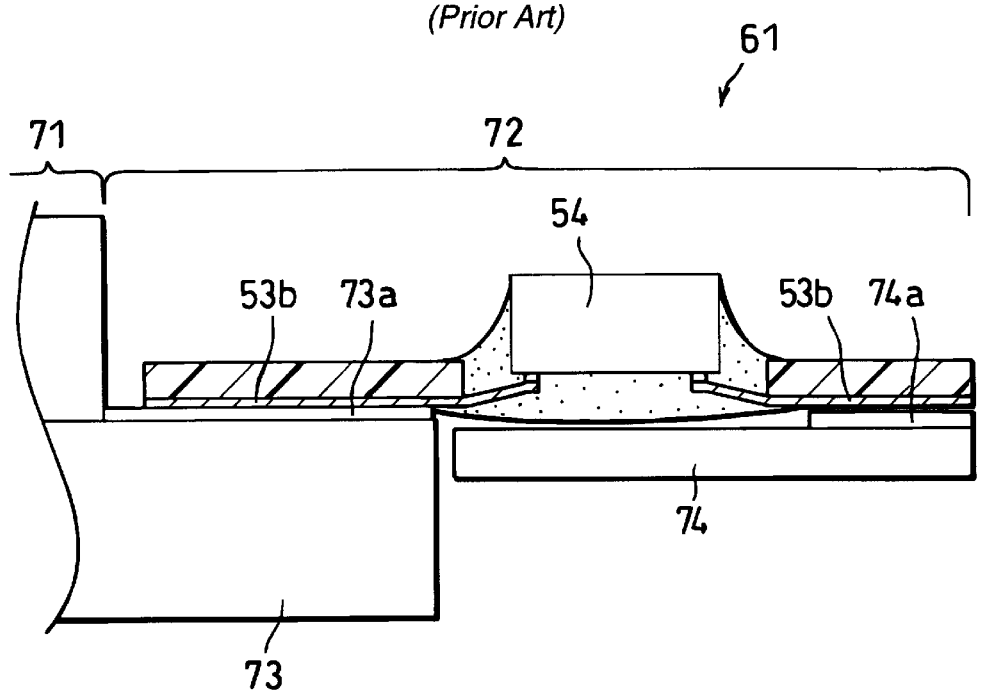
FIG. 16 is an explanatory view showing the state wherein the semiconductor device shown in FIG. 14 is mounted to the liquid crystal module.
Figure 17:
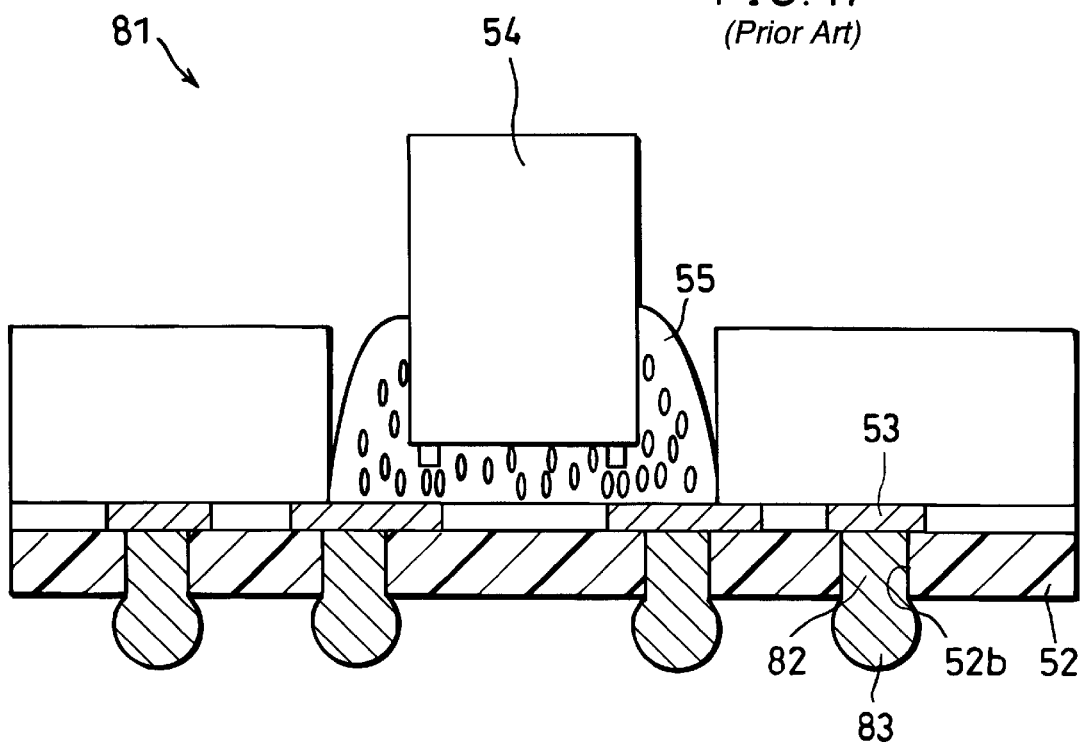
FIG. 17 is a cross-sectional view showing the structure of the third conventional semiconductor device.
Figure 18:
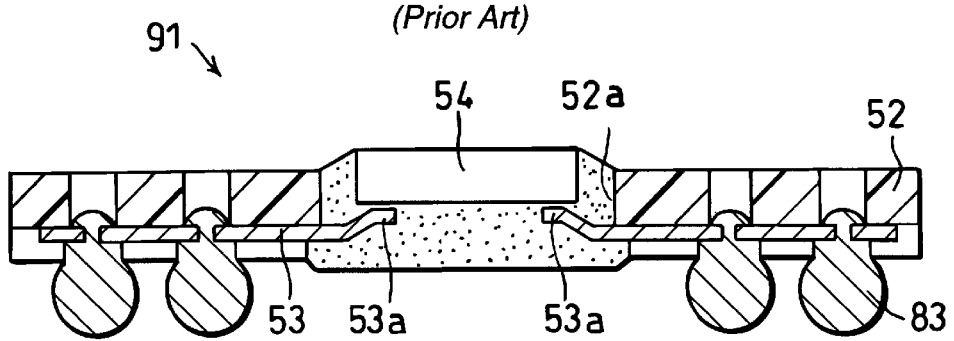
FIG. 18 is a cross-sectional view showing the structure of the fourth conventional semiconductor device.
Figure 19:
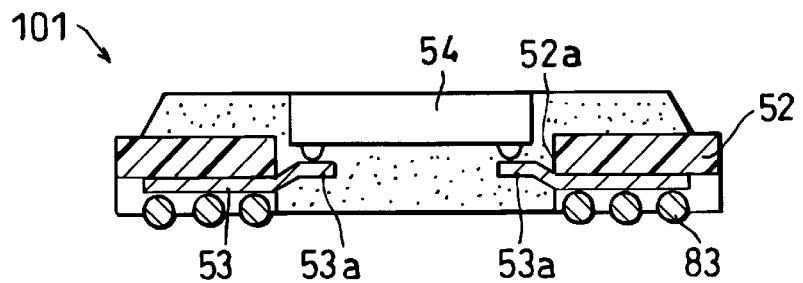
FIG. 19 is a cross-sectional view showing the structure of the fifth conventional semiconductor device.

As described, in the TCP semiconductor device 21 in accordance with the present embodiment, as the inner leads 3a are fixed by the insulating film 4, it is not likely that the inner leads 3a are deformed in the ILB process as compared with the TCP semiconductor device 61 (see FIG. 14) of the inverse bond structure with the device hole 52a. Additionally, when mounting the semiconductor chip 5, connection by the flip-chip method using the ACF 6 can be performed. Therefore, compared with the case of adopting the conventional method wherein bumps 5b made of gold tin eutectic or gold-gold are subject to thermocompression with respect to inner leads each of which being supported by one side on the device hole using a tool heated to high temperature, the semiconductor chip 5 can be connected at significantly lower temperature. Therefore, a damage on the electrodes 5a of the semiconductor chip 5 by the heat generated in the ILB process can be reduced, thereby improving the quality of the TCP semiconductor device 21.

Additionally, as the insulating film 4 is formed on the TCP semiconductor device 21 so as to suppress the tilt, the manufacturing yield in the reflow mounting process can be improved. According to the structure wherein the inner leads 3a projected to the area on the device holes 2a are fixed by the insulating film 4, in the case of connecting the semiconductor chip 5 by the flip-chip method, sealing with resin for mechanically protecting the semiconductor chip 5 and the inner leads 3a is not required. According to the described method, the TCP semiconductor device 21 can be manufactured in a simple manner at low cost.

Furthermore, since the metal wiring pattern 3 can be drawn in the area on the device holes 2a, by arranging such that the part of the metal wiring pattern, which is provided outside of the area of the device hole in the conventional arrangement, the package of the TCP semiconductor device 1 can be reduced in size. Therefore, the liquid crystal module to which the described TCP semiconductor device 1 can be reduced in size, and an improved throughput can be achieved in the manufacturing process for such reduction in size of the liquid crystal module.

Figure 13:
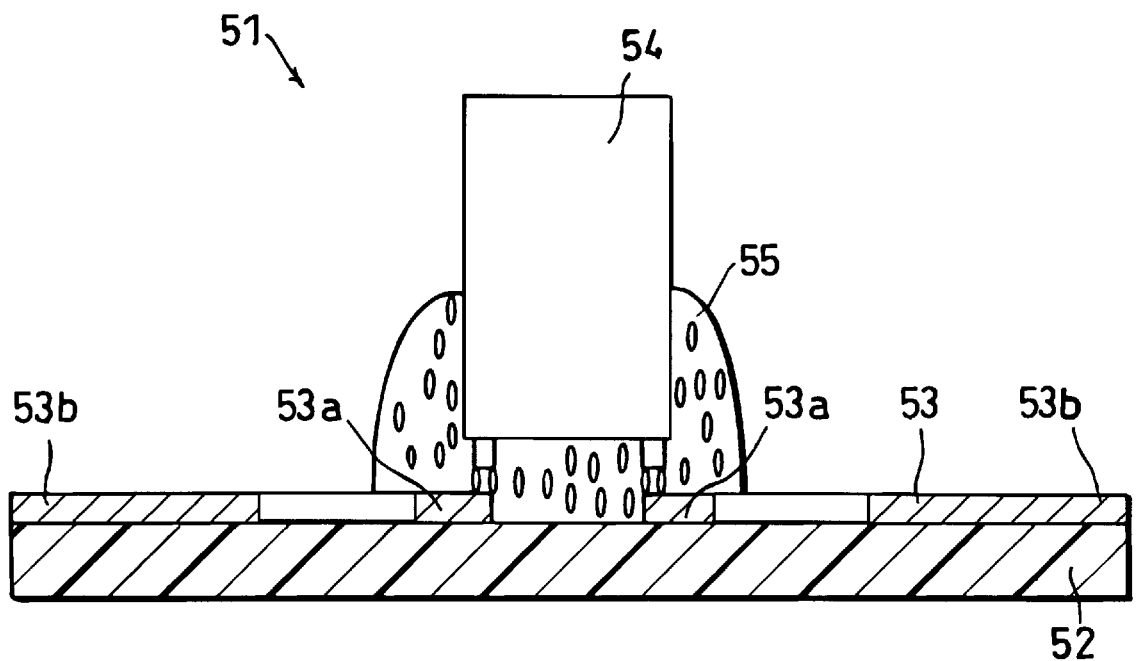
FIG. 13 is a cross-sectional view showing the structure of the first conventional semiconductor device.

In the TCP semiconductor device 21, compared with the conventional TCP semiconductor device 51 (see FIG. 13) of the inverse bonding structure without having the device holes, by adopting the insulating film 4 which is transparent to light, easier alignment in connecting the semiconductor chip 5 can be adopted. Moreover, by adopting the material of an excellent thermal conductivity for the insulating film 4, the semiconductor chip 5 can be connected at low temperature.

Figure 9:
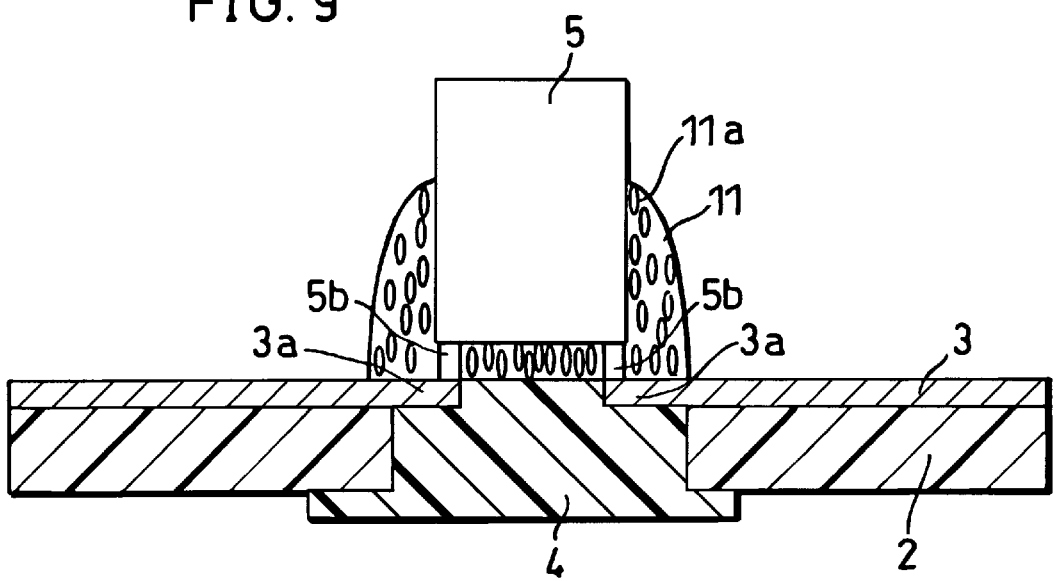
FIG. 9 is a cross-sectional view showing a structure of another semiconductor device in accordance with the second embodiment of the present invention.

In the present embodiment, the semiconductor chip 5 and the inner leads 3a can be connected by the thermocompression of the ACF 6; however, as shown in FIG. 9, it may be also arranged such that bumps 5b made of gold tin eutectic or gold-gold are formed on the semiconductor chip 5, and the resulting bumps 5b are bonded to the inner leads 3b by the thermocompression. In this case, the semiconductor chips 5 and the inner leads 3a are sealed with the resin 11 including the filling agent 11a for releasing the stress.

Third Embodiment

Figure 10:
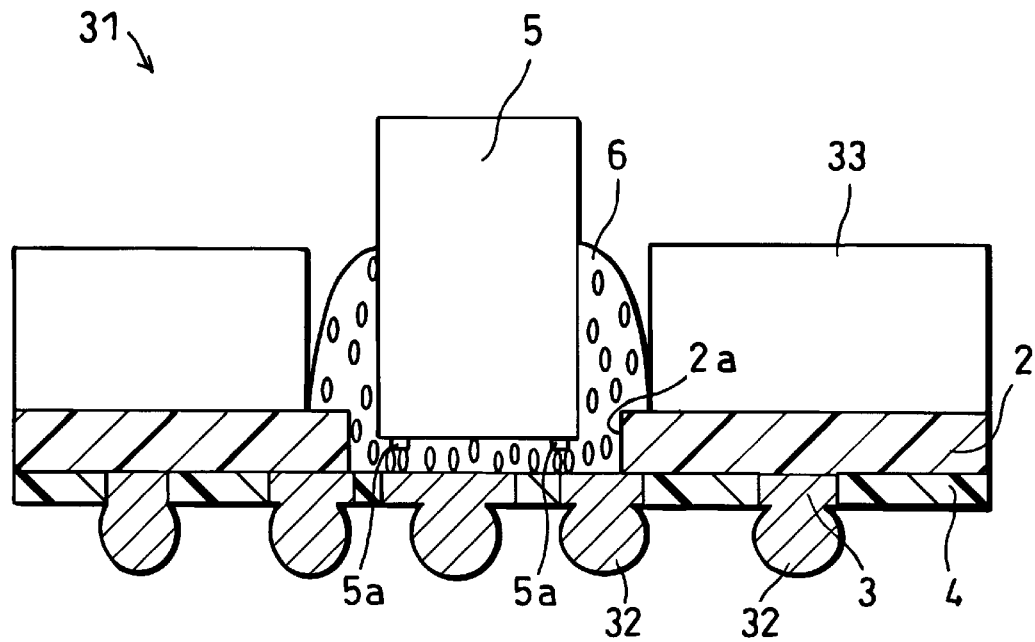
FIG. 10 is a cross-sectional view showing a structure of a semiconductor device in accordance with the third embodiment of the present invention.
Figure 12:
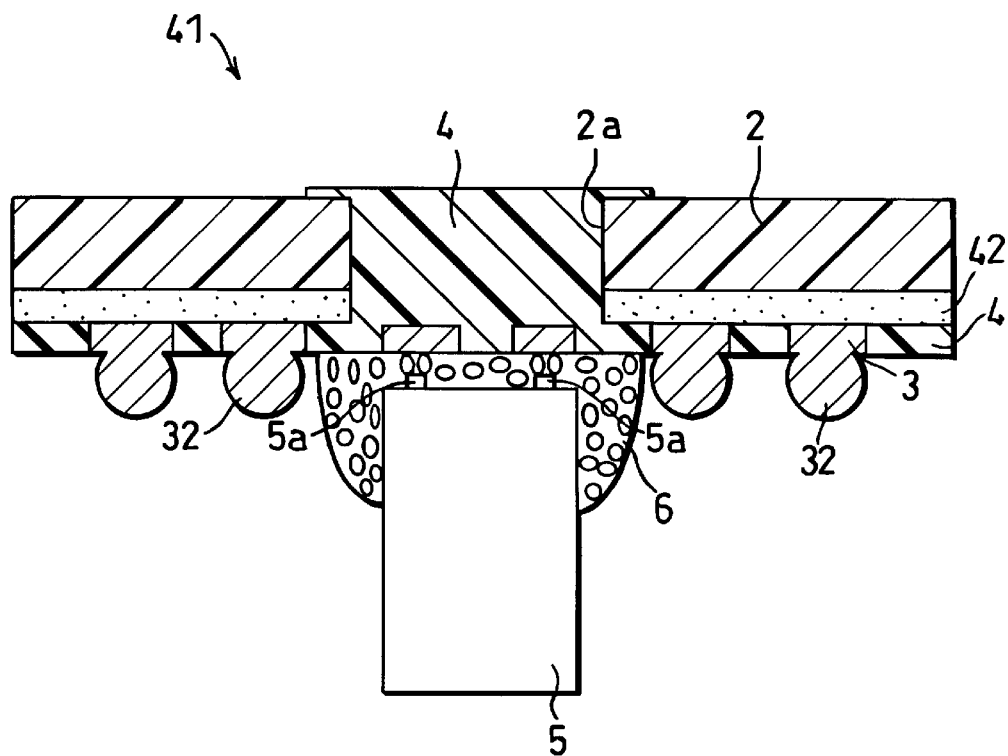
FIG. 12 is a cross-sectional view showing the structure of another semiconductor device in accordance with the third embodiment of the present invention.
Figure 11:
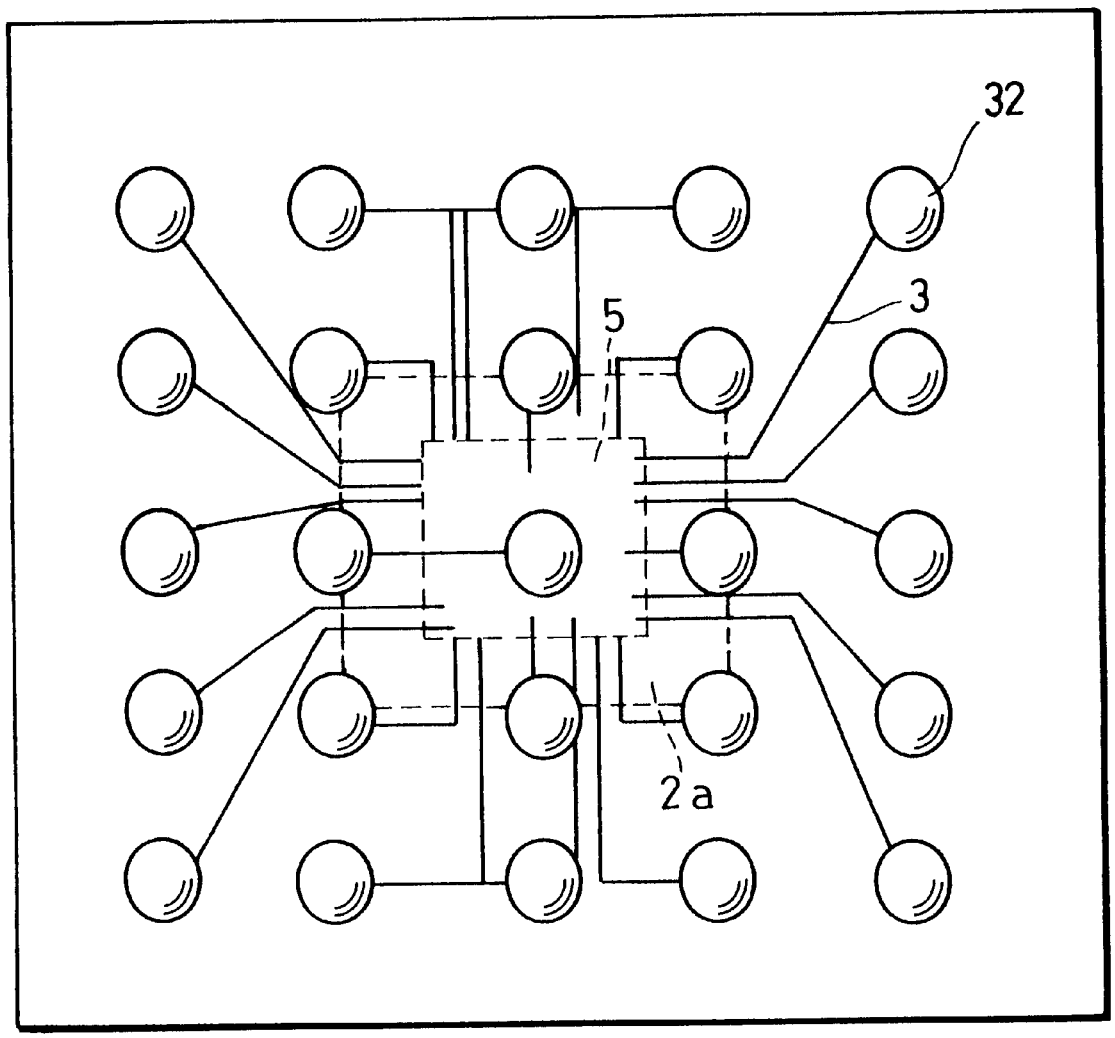
FIG. 11 is a plan view of the semiconductor device shown in FIG. 10 when seen from the side of the metal wiring pattern.

The following descriptions will explain a semiconductor device and a method of manufacturing the same in accordance with still another embodiment of the present invention in reference to FIG. 10 through FIG. 12. For conveniences in explanations, members having the same functions as the aforementioned embodiments will be designated by the same reference numerals, and thus the descriptions thereof shall be omitted here.

In the present embodiment, a TBGA semiconductor device 31 shown in FIG. 10 is adopted. The TBGA semiconductor device 31 includes a substrate 2, a metal wiring pattern 3, solder balls 32 (conductive terminals), an insulating film 4, stiffeners 33 (reinforcing-fixing member), a semiconductor chip 5, and an ACF 6. The TBGA semiconductor device 31 has a normal bond structure wherein the semiconductor chip 5 and the metal wiring pattern 3 are formed on the opposite sides of the substrate 2.

On the surface of the substrate 2 in which the device hole 2a is formed, an insulating film 4 is formed so as to bury the metal wiring pattern 3, thereby drawing the metal wiring pattern 3 also on the device hole 2a. Then, solder balls 32 serving as conductive terminals are formed in predetermined portions of the metal wiring pattern 3 so as to conduct the metal wiring pattern 3 to the external circuit. When the TBGA semiconductor device 31 is seen from the side of the metal wiring pattern 3, the solder balls 32 are formed in a matrix as shown in FIG. 11. The stiffeners 33 are provided for preventing the substrate 2 from being warped or undulated.

The described structure of the TBGA semiconductor device 31 eliminates a need of a complicated structure wherein the semiconductor balls 32 are formed by conducting from the metal wiring pattern formed on the substrate 2 through a throughhole punched in the substrate 2. Namely, according to the structure of the present embodiment, the device hole 2a is formed in the substrate 2, and the insulating film 4 is formed so that the semiconductor chip 5 and the metal filing pattern 3 are formed on opposite sides of the substrate 2, thereby forming the semiconductor balls 32 directly in the metal wiring pattern 3. As a result, the manufacturing cost of the TBGA semiconductor chip 31 can be suppressed, and improved throughput in the manufacturing process can be achieved. Here, although solder balls 32 are formed as conductive terminals, the present invention is not limited to this as long as the solder balls function as conductive use projections.

The region on the device hole 2a is covered with the insulating film 4, and the metal wiring pattern 3 formed in this region is also fixed by the insulating film 4 as in other portion. Therefore, it is no longer necessary to seal with resin for mechanically protecting the semiconductor chip 5 and the metal wiring pattern 4 on the device hole 2a, and conductive terminals can be formed also in this region. As a result, the conductive terminals can be arranged in a full matrix on the metal wiring pattern, and a restriction in the pattern layout can be reduced. As described, according to the described structure of the present embodiment a quality TBGA semiconductor device 31 can be obtained at high yield.

As shown in FIG. 12, the TBGA semiconductor device 21 having an inverse bond structure wherein the semiconductor chip 5 and the metal wiring pattern 3 are formed on the same side of the substrate 2 may be adopted. In this case, the substrate 2, the metal wiring pattern 3 and the insulating film 4 are connected by a bonding agent 42.

As described, the semiconductor device of the present invention which includes a metal wiring pattern formed on a tape-shaped insulating substrate, a semiconductor chip connected to the metal wiring pattern, a device hole punched in a position confronting the semiconductor chip on the substrate in the state where the semiconductor chip is connected to the metal wiring pattern may be arranged so as to further include an insulating film formed so as to cover at least the device hole formed on a side of the substrate opposite to a side where the semiconductor chip is mounted.

According to the described arrangement, since the insulating film is formed so as to cover at least the device hole, the metal wiring pattern can be drawn also in the region on the device hole. Since the insulating film is formed on the opposite side of the semiconductor chip with respect to the substrate, irrespectively of on which side of the substrate the metal wiring pattern is formed, the semiconductor chip can be connected to the metal wiring pattern in the region of the device hole by the flip-chip method.

Therefore, in the case of mounting the liquid crystal module as the TCP semiconductor device, by forming the metal wiring pattern and the semiconductor chip on the opposite sides of the substrate, the metal wiring pattern can be connected both to the glass panel and the input substrate, and the semiconductor chip is provided on the opposite side. This eliminates a need of ensuring a space for storing the semiconductor chip between the glass panel and the input substrate, and the glass panel and the input substrate can be adjacently placed, thereby realizing a narrower frame.

Furthermore, since the inner leads projected in the region on the device hole of the metal wiring pattern are fixed by the insulating film, it is not likely that the inner leads are deformed by the ILB process. In the meantime, by connecting the semiconductor chip to the metal wiring pattern using the ACF by the flip-chip method, an ILB process can be performed at significantly lower temperature than the conventional connecting method wherein bumps made of gold tin eutectic or gold-gold are subjected to thermocompression using a tool heated to high temperature. For the beneficial feature that the semiconductor chip can be connected to the metal wiring pattern at lower temperature, a damage on the electrodes by the semiconductor chip in the ILB process can be reduced, thereby obtaining a quality TCP semiconductor device. Furthermore, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the inner leads of the metal wiring pattern projected to the device hole are fixed by the insulating film, when connecting the semiconductor chip by the flip-chip method, it is not necessary to seal with resin for mechanically protecting the semiconductor chip and the inner leads. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement, within the region on the device hole, a semiconductor device package can be reduced in size. As a result, when mounting the semiconductor chip to the liquid crystal module as a TCP semiconductor device, the liquid crystal module can be reduced in size, and the throughput in the manufacturing process can be improved for this size reduction.

As a result, a semiconductor device is applicable to a quality TCP semiconductor device which realizes a very narrow frame in the liquid crystal module and to a quality TBGA semiconductor device which can be produced at high yield.

The described semiconductor device of the present invention may be arranged such that the metal wiring pattern is formed on the insulating film, or the metal wiring pattern is buried in the insulating film.

According to the described arrangement, since the metal wiring pattern is formed on the insulating film or buried in the insulating film, an area to which the metal wiring pattern is drawn can be increased for the area on the device hole.

The semiconductor device of the present invention may be arranged such that the metal wiring pattern is formed on the portion which covers the device hole of the insulating film.

According to this arrangement, by storing a part of the metal wiring pattern, which is provided outside of the device hole in the conventional arrangement, within the region on the device hole, a semiconductor package can be reduced in size. As a result, a module such as a liquid crystal module to which the semiconductor device is mounted can be reduced in size, and the throughput in the manufacturing process can be improved for the reduction in size.

The semiconductor device of the present invention may be arranged so as to include conductive terminals for conducting the metal wiring pattern formed so as to cover the device hole of the insulating film to an external circuit.

The conductive terminals are formed on the side of the substrate opposite to the side where the semiconductor chip is mounted. Therefore, in the conventional semiconductor device in which the device hole is not formed, to conduct the metal wiring pattern formed on the side of the semiconductor chip to the external circuit, it is required to form the conductive terminals by punching the throughhole in the substrate. However, according to the present invention, the metal wiring pattern formed on the opposite side of the semiconductor chip with respect to the substrate can be connected to the semiconductor chip within the device hole, and the conductive terminals can be directly formed in the metal wiring pattern. As a result, the process of punching the throughhole in the substrate can be omitted, thereby manufacturing the TBGA semiconductor device at low cost and high throughput.

Additionally, the device hole is covered with the insulating film, and the inner leads in the metal wiring pattern formed in this region are fixed by the insulating film. Therefore, the sealing with resin for mechanically protecting the semiconductor chip and the inner leads is not required, and the conductive terminals can be formed also in this region. As a result, the conductive terminals such as semiconductor balls can be arranged in a full matrix on the metal wiring pattern, and a pattern layout is less restricted.

Each of the described arrangements of the semiconductor device of the present invention may be arranged such that the metal wiring pattern and the semiconductor chip are formed on the same side of the substrate.

The described arrangement of the semiconductor device has an inverse bond structure wherein the metal wiring pattern and the semiconductor chip are formed on the same side of the substrate. In this semiconductor device of the inverse bond structure, since the inner leads projected in the region on the device hole of the metal wiring pattern are fixed by the insulating film, it is not likely that the inner leads are deformed in the ILB process. Similarly, by adopting the flip-chip method, the ILB process can be carried out at significantly lower temperature than the case of adopting the conventional method of applying a thermocompression to the bumps. Therefore, in the ILB process, a damage on the electrode by the semiconductor chip can be reduced, and a quality semiconductor device can be obtained.

Furthermore, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the inner leads of the metal wiring pattern projected to the device hole are fixed by the insulating film, when connecting the semiconductor chip by the flip-chip method, it is not necessary to seal with resin for mechanically protecting the semiconductor chip and the inner leads. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement, within the region on the device hole, a semiconductor device package can be reduced in size. As a result, the liquid crystal module to which the semiconductor chip is mounted as a TCP semiconductor device can be reduced in size, and the throughput in the manufacturing process can be improved for this size reduction.

Each of the described semiconductor device of the present invention may be arranged such that the metal wiring pattern and the semiconductor chip are formed on opposite sides of the substrate.

In the described arrangement, the semiconductor device has a normal bond structure wherein the metal wiring pattern and the semiconductor chip are formed on opposite sides of the substrate. When mounting the semiconductor device of the normal bond structure to the liquid crystal module as a TCP semiconductor device, the metal wiring pattern can be connected both to the glass panel and the input substrate, and the semiconductor chip is provided on the opposite side. Therefore, this eliminates a need of ensuring a space for storing the semiconductor chip between the glass panel and the input substrate, and the glass panel and the input substrate can be adjacently placed, thereby reducing the width of the frame.

According to the described arrangement, since the inner leads projected in the region on the device hole of the metal wiring pattern are fixed by the insulating film, it is not likely that the inner leads are deformed by the ILB process. In the meantime, by adopting the flip-chip method, an ILB process can be performed at significantly lower temperature than the conventional connecting method wherein bumps are subjected to thermocompression. As a result, a damage on the electrodes by the semiconductor chip in the ILB process can be reduced, thereby obtaining a quality semiconductor device.

Additionally, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the metal wiring pattern (inner leads) projected to the device hole is fixed by the insulating film, when connecting the semiconductor chip by the flip-chip method, it is not necessary to seal with resin for mechanically protecting the semiconductor chip and the inner leads. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement, within the region on the device hole, a semiconductor device package can be reduced in size. As a result, a liquid crystal module to which the semiconductor chip as a TCP semiconductor device is mounted can be reduced in size, and the throughput in the manufacturing process can be improved for this size reduction.

As described, the method of manufacturing the semiconductor device of the present invention may be arranged so as to include the steps of:

punching a device hole in a tape-shaped insulating substrate at position where a semiconductor chip is to be mounted so as to confront the device hole;

forming a metal wiring pattern on the substrate having formed therein the device hole so as to be projected at least on the substrate;

forming an insulating film on the device hole so as to cover the device hole at least from the side of the substrate, the insulating film being formed so as to fix the metal wiring pattern projected on the device hole; and forming the semiconductor chip on a side of the substrate opposite to a side where the insulating film is formed to be connected to the metal wiring pattern.

The semiconductor device prepared by the described method has an inverse bond structure wherein the metal wiring pattern and the semiconductor chip are formed on the same side of the substrate. In this semiconductor device of the inverse bond structure, since the inner leads projected in the region on the device hole of the metal wiring pattern are fixed by the insulating film, it is not likely that the inner leads are deformed in the ILB process. Similarly, by adopting the flip-chip method, the ILB process can be carried out at significantly lower temperature than the case of adopting the conventional method of thermocompressing the bumps. Therefore, in the ILB process, a damage on the electrodes by the semiconductor chip can be reduced, and a quality semiconductor device can be obtained.

Furthermore, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the metal wiring pattern projected to the device hole (inner leads) is fixed by the insulating film, when connecting the semiconductor chip by the flip-chip method, it is not necessary to seal with resin for mechanically protecting the semiconductor chip and the inner lead. As described, the semiconductor device can be manufactured in a simple manner at low cost.

Furthermore, as the metal wiring pattern can be drawn also in the region on the device hole, by storing the part of the metal wiring pattern, which is provided outside of the device hole in the conventional arrangement within the region on the device hole, a semiconductor device package can be reduced in size. As a result, the liquid crystal module to which the semiconductor chip is mounted as a TCP semiconductor device can be reduced in size, and the throughput in the manufacturing process can be improved for this size reduction.

As described, the method of manufacturing the semiconductor device of the present invention may be arranged so as to include the steps of:

punching a device hole in a tape-shaped insulating substrate at position where a semiconductor chip is to be mounted so as to confront the device hole;

forming a metal wiring pattern on the substrate having formed therein the device hole so as to be projected at least on the substrate;

forming an insulating film on the device hole so as to cover the device hole at least from the side of the metal wiring pattern, the insulating film being formed so as to fix the metal wiring pattern projected on the device hole; and forming the semiconductor chip on a side of the substrate opposite to a side where the insulating film is formed to be connected to the metal wiring pattern.

In the described arrangement, the semiconductor device has a normal bond structure wherein the metal wiring pattern and the semiconductor chip are formed on opposite sides of the substrate. When mounting the semiconductor device of the normal bond structure to the liquid crystal module as a TCP semiconductor device, the metal wiring pattern can be connected both to the glass panel and the input substrate, and the semiconductor chip is provided on the opposite side. This eliminates a need of ensuring a space for storing the semiconductor chip between the glass panel and the input substrate, and the glass panel and the input substrate can be adjacently placed, thereby realizing a narrower frame.

Furthermore, since the inner leads projected in the region on the device hole of the metal wiring pattern are fixed by the insulating film, it is not likely that the inner leads are deformed by the ILB process. In the meantime, by adopting the flip-chip method, an ILB process can be performed at significantly lower temperature than the conventional connecting method wherein bumps are subjected to thermocompression. As a result, a damage on the electrodes by the semiconductor chip in the ILB process can be reduced, thereby obtaining a quality semiconductor device.

Furthermore, by arranging such that the insulating film has substantially the same coefficient of linear thermal expansion as the substrate, the warpage of the package of the semiconductor device can be reduced. As a result, an improved yield of the manufacturing process when reflow mounting can be achieved. Furthermore, since the metal wiring pattern projected to the device hole (inner leads) is fixed by the insulating film, when connecting the semiconductor chip by the flip-chip method, it is not necessary to seal with resin for mechanically protecting the semiconductor chip and the inner leads. As described, according to the above method of the present invention, the semiconductor device can be manufactured in a simple manner at low cost.

Furthermore, as the metal wiring pattern can be drawn also in the region on the device hole, by storing a part of the metal wiring pattern, which is provided outside of the device hole in the conventional arrangement, within the region on the device hole, a semiconductor device package can be reduced in size. As a result, the liquid crystal module to which the semiconductor chip is mounted as a TCP semiconductor device can be reduced in size, and the throughput in the manufacturing process can be improved for this size reduction.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A semiconductor device comprising:

a semiconductor chip;

a tape-shaped insulating substrate with a device hole facing said semiconductor chip;

a metal wiring pattern formed on said substrate, said metal wiring pattern being connected to said semiconductor chip by an anisotropic conductive film; and an insulating film covering the device hole at least from a side of said substrate opposite to a side where the semiconductor chip is mounted.

2. The semiconductor device as set forth in claim 1, wherein:

said metal wiring pattern is formed on said insulating film.

3. The semiconductor device as set forth in claim 2, wherein:

said metal wiring pattern is formed on said insulating film so as to cover the device hole.

4. The semiconductor device as set forth in claim 1, wherein:

said metal wiring pattern is buried in said insulating film.

5. The semiconductor device as set forth in claim 4, wherein:

said metal wiring pattern is formed on said insulating film so as to cover the device hole.

6. The semiconductor device as set forth in claim 3, wherein:

said metal wiring pattern formed on said insulating film so as to cover the device hole includes conductive terminals for connecting said metal wiring pattern to an external circuit.

7. The semiconductor device as set forth in claim 6, wherein:

said conductive terminals are solder balls.

8. The semiconductor device as set forth in claim 1, wherein:

said metal wiring pattern and said semiconductor chip are formed on a same side of said substrate.

9. The semiconductor device as set forth in claim 1, wherein:

said metal wiring pattern and said semiconductor chip are formed on opposite sides of said substrate.

10. The semiconductor device as set forth in claim 1, wherein:

said metal wiring pattern includes
inner leads projecting over the device hole in said substrate, wherein said inner leads are fixed by said insulating film.

11. The semiconductor device as set forth in claim 1, wherein:

said insulating film has substantially a same coefficient of linear expansion as that of the substrate.

12. The semiconductor device as set forth in claim 1, wherein:

said insulating film is made of a solder resist.

13. The semiconductor device as set forth in claim 1, further comprising:

a stiffening member for preventing said substrate from being deformed.

* * * * *